United States Patent
Kondo

(12) 
(10) Patent No.: US 6,177,969 B1
(45) Date of Patent: Jan. 23, 2001

(54) MATRIX SUBSTRATE AND LIQUID CRYSTAL DISPLAY DEVICE UTILIZING THE SAME IN WHICH A CONDUCTIVE FILM IN AN APERTURE REGION OPPOSES THE SIDE THE SWITCHING ELEMENTS ARE ON

(75) Inventor: Shigeki Kondo, Hiratsuka (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/044,018

(22) Filed: Mar. 19, 1998

(30) Foreign Application Priority Data

Mar. 21, 1997 (JP) .................................... 9-068158

(51) Int. Cl.⁷ .......................... G02F 1/1333; H01L 29/06
(52) U.S. Cl. ............................ 349/40; 349/160; 257/619; 257/622
(58) Field of Search ................................ 349/160, 40, 42, 349/111, 113; 257/586, 618, 619, 622

(56) References Cited

U.S. PATENT DOCUMENTS

| | | | |
|---|---|---|---|
| 4,038,580 | * 7/1977 | Porret | 257/619 |
| 4,431,271 | * 2/1984 | Okubo | 349/42 |
| 4,840,462 |   6/1989 | Hartmann | 350/350 S |
| 4,906,894 | * 3/1990 | Miyawaki et al. | 257/622 |
| 5,317,433 |   5/1994 | Miyawaki et al. | 359/59 |
| 5,513,028 |   4/1996 | Sono et al. | 359/87 |
| 5,633,182 |   5/1997 | Miyawaki et al. | 438/30 |

FOREIGN PATENT DOCUMENTS

| | | | |
|---|---|---|---|
| 2-18521 | * 1/1990 | (JP) | 349/113 |
| 4-265961 | * 9/1992 | (JP) | 349/40 |
| 7182996 | 7/1995 | (JP) . | |

* cited by examiner

Primary Examiner—Walter J. Malinowski
(74) Attorney, Agent, or Firm—Fitzpatrick, Cella, Harper & Scinto

(57) ABSTRACT

Provided is a matrix substrate provided with a plurality of switching elements corresponding to a plurality of electrodes arranged in a matrix pattern, comprising a conductive layer on a face of said substrate opposite to the face thereof bearing said switching elements.

24 Claims, 5 Drawing Sheets

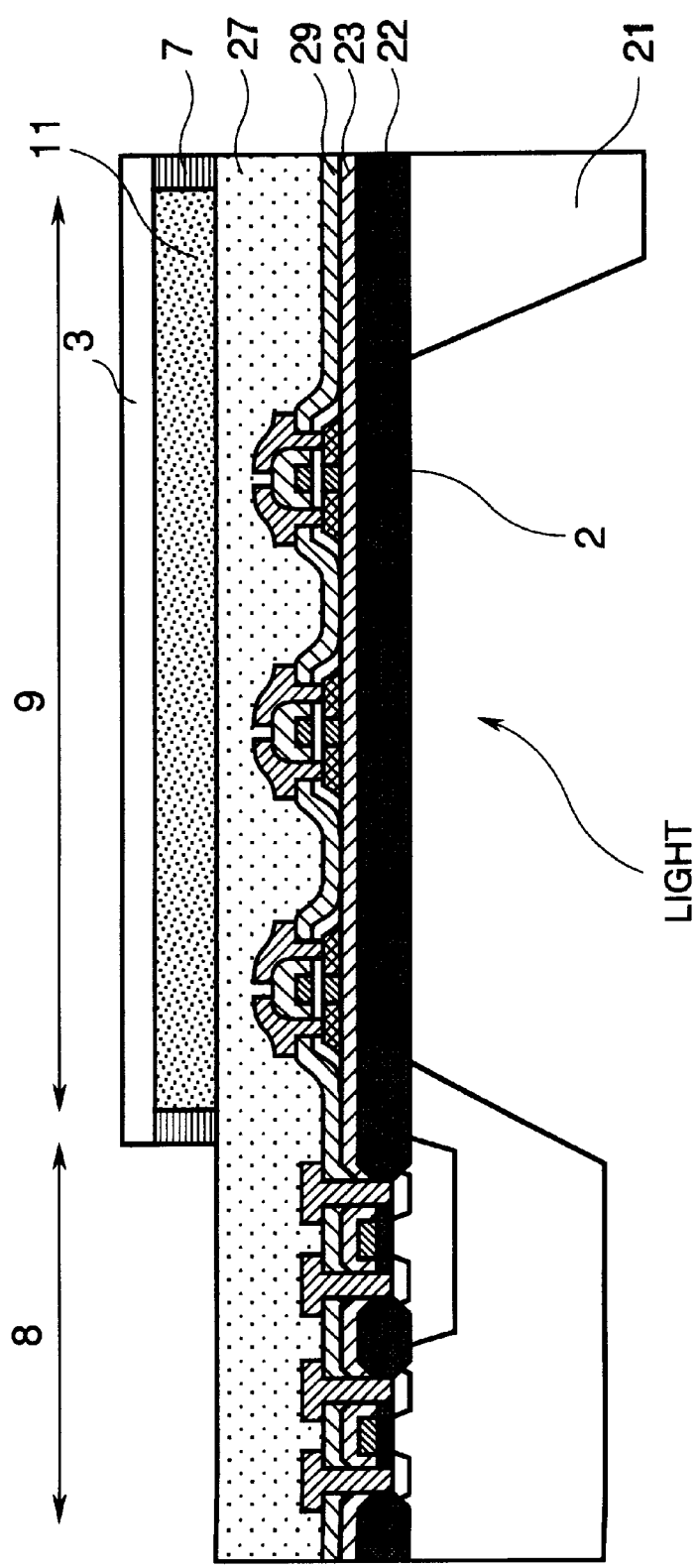

10

MATRIX SUBSTRATE AND LIQUID CRYSTAL DISPLAY DEVICE UTILIZING THE SAME IN WHICH A CONDUCTIVE FILM IN AN APERTURE REGION OPPOSES THE SIDE THE SWITCHING ELEMENTS ARE ON

BACKGROUND OF THE INVENTION

1. Field of the Invention

The present invention relates to an active matrix substrate to switch pixel electrodes by switching elements, and a liquid crystal display device utilizing such matrix substrate.

2. Related Background Art

The liquid crystal display device provided with a switching element in each pixel is widely employed in combination with the twisted nematic (TN) liquid crystal, and has been commercialized as the flat panel displays and as the projection television displays. The above-mentioned switching element, represented by a thin film transistor (TFT), a diode element or a metal-insulator-metal (MIM) element, assists the optical switching response of the liquid crystal by maintaining a voltage applied state longer than the actual line selecting period of the TN liquid crystal of a relatively slow response, and provides the liquid crystal lacking the memory property (self-supporting property), such as the TN liquid crystal, with a substantial memory state during a frame period by maintaining the above-mentioned voltage applied state. Also the use of such switching elements in principle avoids crosstalk between the lines or between the pixels, thereby providing satisfactory display characteristics.

In recent years, there has also been developed ferroelectric liquid crystal (FLC) having a faster response in comparison with the TN liquid crystal, and there have been announced a display panel and a light valve utilizing such ferroelectric liquid crystal. The display characteristics may be further improved by the combination of the FLC and the above-mentioned switching elements. The combination of FLC and TFT mentioned above is disclosed, for example, in the U.S. Pat. No. 4,840,462 and in "Ferroelectric Liquid-Crystal Video Display", Proceeding of the SID, Vol. 30, 1989.

In the following there will be explained, as an example, the use of the thin film transistor (TFT) as the switching element. FIG. 4 shows the configuration of a liquid crystal display device provided with a plurality of switching elements corresponding to a plurality of pixel electrodes. In FIG. 4, a glass substrate 1 is provided thereon with a peripheral circuit 8' and TFT's 2 corresponding to pixel electrodes. Between a counter glass substrate 3 opposed to the pixel electrodes and the matrix substrate 1 there is formed an area surrounded by a seal portion 7, and liquid crystal 11 is contained in such area. Color filters may be provided either on the matrix substrate 1 or on the counter glass substrate 3. There are also shown a peripheral circuit portion 8, and an image display portion 9. The counter glass substrate 3 is provided, on the substantially entire area opposed to the matrix substrate 1, with a common transparent electrode 4 composed for example of ITO (indium-tin oxide). On the other hand, the matrix substrate 1 is provided with wirings for signal transfer, but does not basically have an electrode, extended over the entire area, as in the case of the counter substrate 3.

Also the Japanese Patent Application Laid-open No. 7-182996 of the present applicant discloses an active matrix liquid crystal display device utilizing a Si substrate. FIG. 5 is a cross-sectional view showing an example of such liquid crystal display device, wherein shown are a Si substrate 21 constituting the matrix substrate, a field oxide film 22, NSG (non-doped silicate glass) 23 and 29, a counter substrate 3 provided with color filters, a sealant 7, liquid crystal 11, and a transparent insulating film 27. The lower part of the Si substrate 21 is eliminated to obtain a transparent image display area 9. The TFT 2 etc. connected to the pixel electrode are fixed to the field oxide film 22 and the NSG 23. Reference numeral 8 is a peripheral circuit portion.

The present inventor has investigated such conventional structures and have clarified the following drawbacks in the actual handling of the liquid crystal display device.

As explained in the foregoing, since the liquid crystal display device utilizes an insulating substrate such as glass, it is easily affected by electrostatic charge. Electrostatic charge is easily generated by contact with a human body or with a foreign material. The present inventors have tried an experiment to apply charge with an electrostatic probe from the side of the counter substrate and the side of the matrix substrate.

In case of charging from the side of the counter substrate, the display characteristics are scarcely affected even with charging of ±10 kV with the electrostatic probe. Such charging amount of ±10 kV corresponds to twice of the electrostatic charging amount by the human body (±5 kV) which is ordinarily employed for testing the insulation between the terminals of the IC's.

On the other hand, in case of charging from the side of the matrix substrate, it is found that the display may generate a defect in case the charging amount with the electrostatic probe exceeds −5 kV. Such defect in the display can appear in various forms, such as a bright spot in a black image display, a black spot in a white image display, or a plurality of such defects. This phenomenon is presumably caused by a fact that, because a face of the matrix substrate opposite to the face thereof bearing the pixel electrodes has more chances of contacting foreign matters, an electrostatic charge is induced at first on the rear face of the matrix substrate, thereby correspondingly inducing an electrostatic charge on the front face of the matrix substrate (face bearing the TFT) whereby such electrostatic charge deteriorates the characteristics of the TFT or induces an erroneous function thereof.

The present inventor has estimated that the electrostatic charge from the side of the counter substrate does not affect the characteristics of the TFT because of the shield effect of the common ITO electrode formed on the counter substrate. Based on these facts, the present inventor has reached the present invention.

SUMMARY OF THE INVENTION

In consideration of the foregoing, an object of the present invention is to provide a liquid crystal display device capable of preventing generation of defect in the display resulting from the electrostatic charge or external noises, thereby providing stable image display.

The object above can be achieved by the present invention described below.

According to the present invention, there is provided a matrix substrate provided with a plurality of switching elements corresponding to a plurality of electrodes provided in a matrix pattern, comprising a conductive layer on a face of the matrix substrate opposed to the face thereof bearing the switching elements.

According to the present invention, there is also provided a liquid crystal display device composed of a matrix substrate provided with a plurality of switching elements corresponding to a plurality of electrodes provided in a matrix pattern, a substrate opposed to the plural electrodes, and a liquid crystal material provided between the above-mentioned substrates, comprising a conductive layer on a face of the matrix substrate opposed to the face thereof bearing the switching elements.

BRIEF DESCRIPTION OF THE DRAWINGS

FIG. 5 is a schematic cross-sectional view of conventional liquid crystal display devices.

DETAILED DESCRIPTION OF THE PREFERRED EMBODIMENTS

Figure 1A:
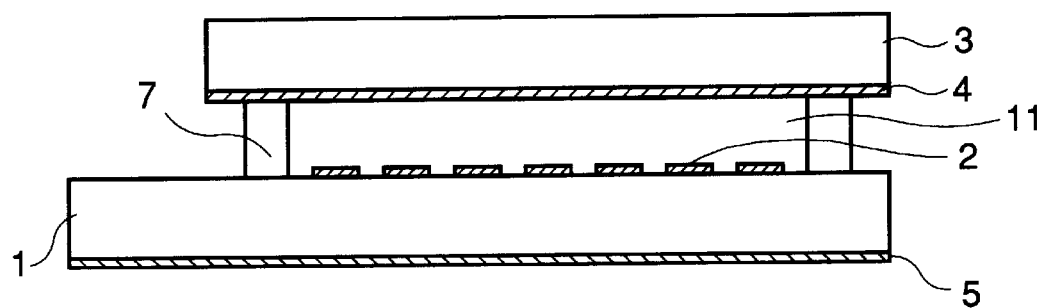
FIGS. 1A and 1B are schematic cross-sectional views showing liquid crystal display devices constituting embodiments 1 and 2 of the present invention.

Embodiment 1:

FIG. 1A is a cross-sectional view of an active matrix liquid crystal display device constituting an embodiment 1 of the present invention, wherein a glass substrate 1 is provided thereon with TFT's 2 respectively corresponding to a plurality of pixel electrodes. A counter substrate 3 is provided with a common electrode composed of an ITO film, and with color filters (not shown). In this embodiment, the glass substrate 1, bearing the TFT's thereon, is also provided with an optically transparent ITO film 5 of a thickness of 1,400 Å on a face thereof not provided with the TFT's. Reference numerals 4, 7 and 11 are a common transparent electrode, a seal portion and a liquid crystal, respectively.

The active matrix liquid crystal display device of the present embodiment did not show any defect in the display, even under the application of an electrostatic charge of ±10 kV or −10 kV from the exterior of the matrix substrate 1. Thus, the active matrix liquid crystal display device of this embodiment proved to have sufficient resistance to the electrostatic charge that was anticipated to be generated under the ordinary condition of use.

Figure 3A:
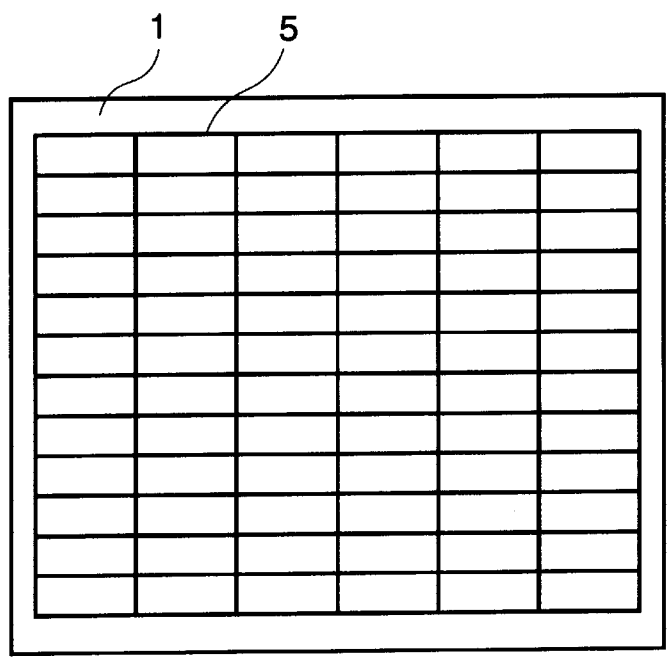
FIGS. 3A and 3B are schematic views showing examples of arrangement of the conductive layer applicable to the present invention.
Figure 3B:
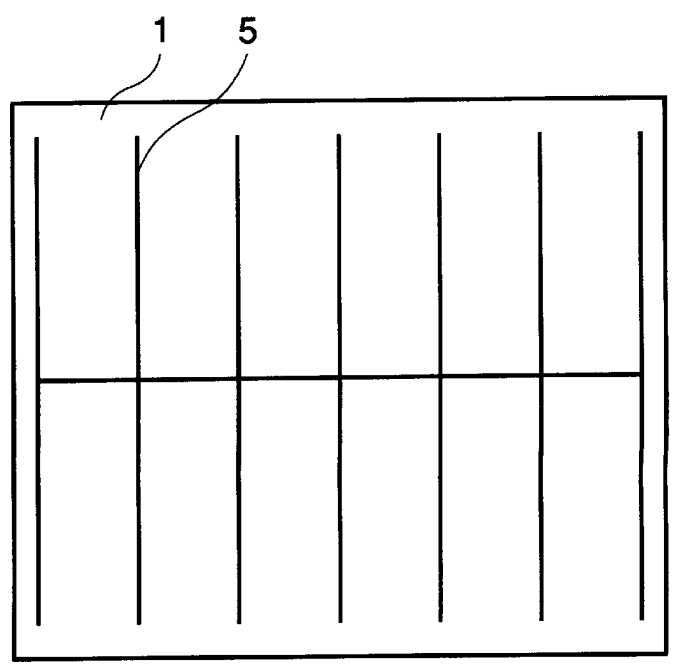
Figure 4:
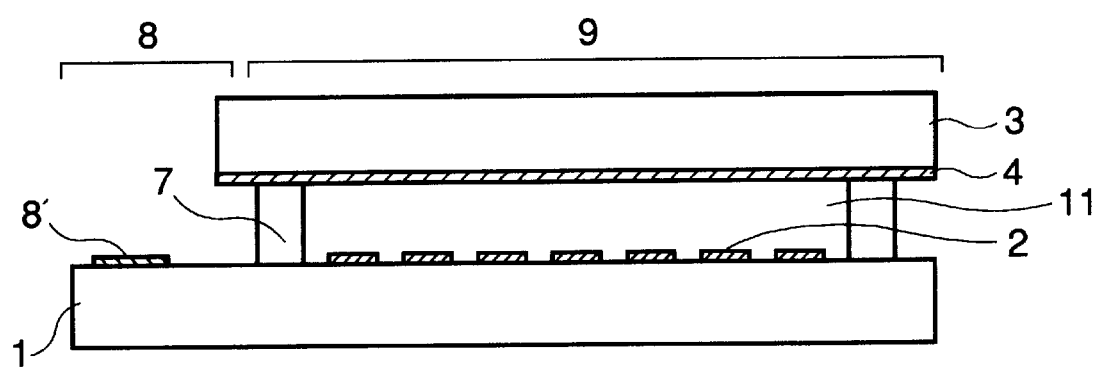
FIG. 4 is a schematic cross-sectional view of conventional liquid crystal display devices.

In the present embodiment, the conductive layer composed of the ITO film is formed on the entire rear face of the matrix substrate. A larger area of the conductive layer is desirable, but such conductive layer need not necessarily be formed on the entire surface of the substrate. The area of the conductive layer is to be formed within a range of 10 to 100%, preferably 20 to 100%, of the rear surface area of the substrate. Also the substrate 1 may be provided with the conductive layer 5 in a mesh pattern as shown in FIG. 3A, or in a comb-teeth pattern as shown in FIG. 3B.

The thickness of the conductive layer to be formed can be selected in such a range as to attain the effect of the present invention, but is generally selected within a range of 100 Å to 1 µm, preferably 500 to 5,000 Å, more preferably 1,000 to 2,000 Å.

Figure 1B:
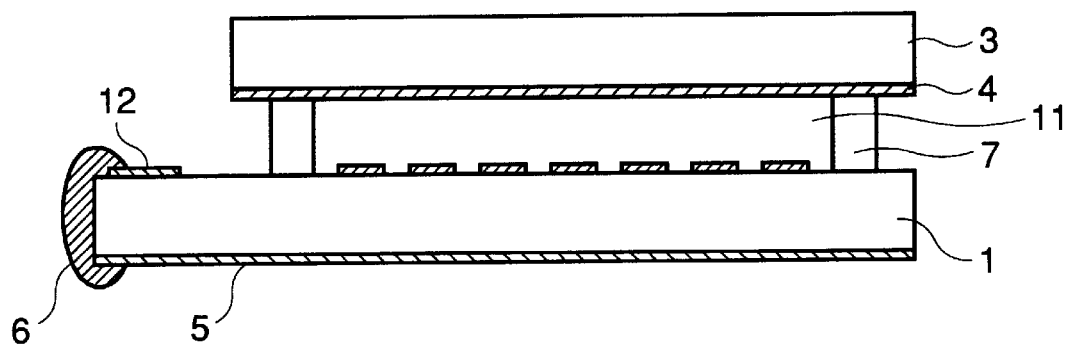

Embodiment 2:

FIG. 1B is a cross-sectional view of an active matrix liquid crystal display device constituting an embodiment 2 of the present invention, wherein components same as those in FIG. 1A are represented by same reference numerals as in FIG. 1A. In this embodiment, an ITO film 5 is formed, on the glass substrate 1 bearing the TFT's, on a face thereof not provided with the TFT's. Also in order to fix the potential of the ITO film 5, it is electrically connected, by means of silver paste 6, with an external lead pad 12 formed on the TFT bearing face.

The active matrix liquid crystal display device of this embodiment did not show any defect in the display, even under the application of an electrostatic charge of +10 kV or −10 kV from the exterior of the matrix substrate.

Thus the active matrix liquid crystal display device of this embodiment proved to have sufficient resistance to the electrostatic charge that was anticipated to be generated under the ordinary condition of use. Also the ITO film 5 of this embodiment, of which potential is fixed from the outside, shows a shield effect not only to the electrostatic charging but also to the ambient electrical noises.

Figure 2A:
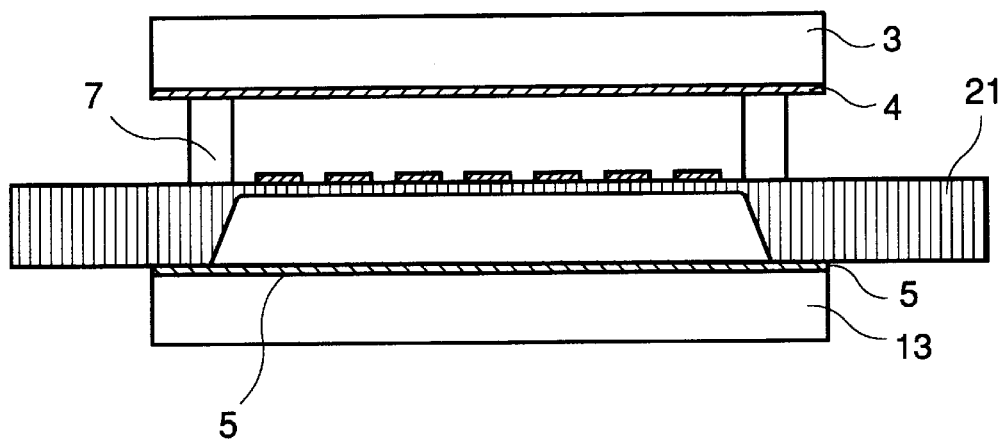
FIGS. 2A and 2B are schematic cross-sectional views showing liquid crystal display devices constituting embodiments 3 and 4 of the present invention.

Embodiment 3:

FIG. 2A is a cross-sectional view of an active matrix liquid crystal display device constituting an embodiment 3 of the present invention. The embodiment 3 provides a liquid crystal display device formed with a Si substrate. The ITO film 5 is deposited in advance on a protective glass plate 13 for an aperture formed in a semiconductor substrate 21, and the glass plate 13 is then adhered to the aperture formed in the semiconductor substrate 21. The potential of the ITO film is not particularly controlled. The ITO film may be deposited on either face of the protective glass plate, but is preferably formed on the aperture side as illustrated because of less possibility of being damaged. Reference numerals 4 and 7 have the same meaning as in Embodiment 1.

[Embodiment 4]

Figure 2B:
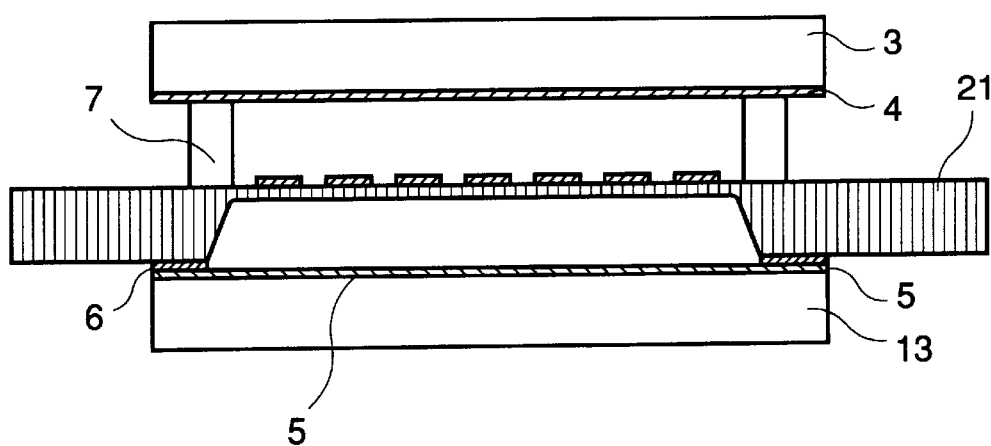

FIG. 2B is a cross-sectional view of an active matrix liquid crystal display device constituting an embodiment 4 of the present invention. The embodiment 4 is provided, in addition to the configuration of the embodiment 3, with a means for fixing the potential of the ITO film 5. The potential fixation is achieved by the use of conductive adhesive 6 such as conductive paste for the adhesion of the protective glass bearing the ITO film 5. The ITO film is adhered to a bulk silicon portion where the peripheral circuits are formed and which is maintained at the power supply voltage for such circuits. It is therefore not necessary to provide a new electrode, for fixing the potential of the ITO film 5 as the shield film, as in the embodiment 2. Reference numerals 4, 6, 7, 13 and 21 have the same meaning as in Embodiments 2 and 3.

[Other embodiments]

The foregoing embodiments have described the cases of employing TFT's as the switching elements, but similar effects can naturally be obtained also in case of employing the aforementioned diode elements or MIM elements. Also there have only been described transmissive liquid crystal display devices, but the drawbacks that have lead to the present invention are not limited to such transmissive display devices. The configuration of the present invention is applicable also to reflective display devices. In such case the transparent conductive film such as the ITO film is no longer necessary and may be replaced by an opaque metal film such as of Al, Cr, Ta, Ti or Cu. The configurations shown in the embodiments 1 to 4 of the present invention are naturally applicable, with or without suitable arrangements.

What is claimed is:

1. A liquid crystal display device comprising a matrix substrate provided with a plurality of switching elements corresponding to a plurality of electrodes arranged in a matrix pattern on a silicon substrate, said silicon substrate having an aperture in the region provided with said switching elements, a counter substrate opposed to said plurality of switching elements, and a liquid crystal material provided between said matrix substrate and said counter substrate, wherein the liquid crystal display device comprises a conductive film in the aperture region of a face of said silicon substrate opposite to the face thereof bearing said switching elements.

2. The liquid crystal display device according to claim 1, wherein said conductive layer is provided with an area within a range of from 10 to 100% of the area of the face, bearing said conductive layer, of said matrix substrate.

3. The liquid crystal display device according to claim 2, wherein said area is within a range of from 20 to 100%.

4. The liquid crystal display device according to claim 2, wherein said conductive layer is provided on the entire area of said matrix substrate.

5. The liquid crystal display device according to claim 2, wherein said conductive layer is provided in a mesh pattern.

6. A liquid crystal display device according to claim 2, wherein said conductive layer is provided in a comb-teeth pattern.

7. The liquid crystal display device according to claim 1, wherein said conductive layer has a thickness within a range of from 100 Å to 1 μm.

8. The liquid crystal display device according to claim 7, wherein said conductive layer has a thickness within a range of from 500 to 5,000 Å.

9. The liquid crystal display device according to claim 8, wherein said conductive layer has a thickness within a range of from 1,000 to 2,000 Å.

10. The liquid crystal display device according to claim 1, wherein said conductive layer is selected from optically substantially transparent films.

11. The liquid crystal display device according to claim 10, wherein said transparent film is composed of ITO.

12. The liquid crystal display device according to claim 1, wherein said conductive layer is selected from Al, Cr, Ta, Ti and Cu.

13. The liquid crystal display device according to claim 1, further comprising a means for fixing the potential of said conductive layer.

14. A matrix substrate comprising a plurality of switching elements corresponding to a plurality of electrodes arranged in a matrix pattern on a silicon substrate, said silicon substrate having an aperture in the region provided with said switching elements, said matrix substrate further comprising a conductive film in the aperture region of a face of said silicon substrate opposite to the face thereof bearing said switching elements, wherein said conductive film is provided in a mesh pattern.

15. A matrix substrate comprising a plurality of switching elements corresponding to a plurality of electrodes arranged in a matrix pattern on a silicon substrate, said silicon substrate having an aperture in the region provided with said switching elements, said matrix substrate further comprising a conductive film in the aperture region of a face of said silicon substrate opposite to the face thereof bearing said switching elements, wherein said conductive film is provided in a comb-teeth pattern.

16. A matrix substrate comprising a plurality of switching elements corresponding to a plurality of electrodes arranged in a matrix pattern on a silicon substrate, said silicon substrate having an aperture in the region provided with said switching elements, said matrix substrate further comprising a conductive film in the aperture region of a face of said silicon substrate opposite to the face thereof bearing said switching elements, wherein said conductive film is Al, Cr, Ta, Ti or Cu.

17. The matrix substrate according to claim 14, 15 or 16, wherein said conductive layer is provided with an area within a range from 10 to 100% of the area of the face, bearing said conductive layer, of said matrix substrate.

18. The matrix substrate according to claim 17, wherein said area is within a range of from 20 to 100%.

19. The matrix substrate according to claim 14, 15 or 16, wherein said conductive layer has a thickness within a range of from 100 Å to 1 μm.

20. The matrix substrate according to claim 19, wherein said conductive layer has a thickness within a range of from 500 to 5,000 Å.

21. The matrix substrate according to claim 14, 15 or 16 wherein said conductive layer has a thickness within a range of from 1,000 to 2,000 Å.

22. The matrix substrate according to claim 14 or 15, wherein said conductive layer is selected from optically substantially transparent films.

23. The matrix substrate according to claim 22, wherein said transparent film is composed of ITO.

24. The matrix substrate according to claim 14, 15 or 16, further comprising a means for fixing the potential of said conductive layer.

\* \* \* \* \*

UNITED STATES PATENT AND TRADEMARK OFFICE
CERTIFICATE OF CORRECTION

PATENT NO. : 6,177,969 B1
DATED : January 23, 2001
INVENTOR(S) : Shigeki Kondo

It is certified that error appears in the above-identified patent and that said Letters Patent is hereby corrected as shown below:

Title page,
Item [56], References Cited, under FOREIGN PATENT DOCUMENTS, "7182996" should read -- 7-182996 --.

Column 4,
Line 55, "lead" should read -- led --.

Column 5,
Line 7, "film" should read -- layer --;
Line 21, "A" should read -- The --; and
Line 22, "comb-teeth" should read -- comb-tooth --.

Column 6,
Lines 1, 3, 10, 12, 20 and 22, "film" should read -- layer --;
Line 13, "comb-teeth" should read -- comb-tooth --;
Line 35, "16" should read -- 16, --; and
Line 38, "to" should read -- to either of --.

Signed and Sealed this

Nineteenth Day of March, 2002

Attest:

JAMES E. ROGAN
*Attesting Officer*  *Director of the United States Patent and Trademark Office*